United States Patent
Yates et al.

(10) Patent No.: US 6,809,824 B1
(45) Date of Patent: Oct. 26, 2004

(54) ALIGNMENT PROCESS FOR INTEGRATED CIRCUIT STRUCTURES ON SEMICONDUCTOR SUBSTRATE USING SCATTEROMETRY MEASUREMENTS OF LATENT IMAGES IN SPACED APART TEST FIELDS ON SUBSTRATE

(75) Inventors: Colin D. Yates, San Jose, CA (US); Nicholas F. Pasch, Pacifica, CA (US); Nicholas K. Eib, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 210 days.

(21) Appl. No.: 10/006,398

(22) Filed: Nov. 30, 2001

(51) Int. Cl.$^7$ .......................... G01B 11/00; G01B 11/24
(52) U.S. Cl. ...................... 356/400; 356/401; 356/603; 356/604; 430/22; 430/30
(58) Field of Search ................................ 356/401, 400, 356/399, 603, 604, 610, 445; 430/22, 30, 5, 8

(56) References Cited

U.S. PATENT DOCUMENTS

| | | | | |
|---|---|---|---|---|
| 5,496,669 A | * | 3/1996 | Pforr et al. | 430/22 |
| 5,607,800 A | * | 3/1997 | Ziger | 430/8 |
| 6,259,521 B1 | * | 7/2001 | Miller et al. | 356/237.5 |
| 6,433,878 B1 | * | 8/2002 | Niu et al. | 356/603 |
| 6,482,572 B1 | * | 11/2002 | Honeycutt et al. | 430/311 |
| 6,498,640 B1 | * | 12/2002 | Ziger | 355/53 |
| 6,500,591 B1 | * | 12/2002 | Adams | 430/30 |
| 6,561,706 B2 | * | 5/2003 | Singh et al. | 396/611 |
| 6,582,863 B1 | * | 6/2003 | Stirton et al. | 430/30 |
| 6,614,540 B1 | * | 9/2003 | Stirton | 356/630 |

OTHER PUBLICATIONS

Bischoff, Joerg, et al., "Light–Diffraction–Based Overlay Measurement", (Presented at the Metrology, Inspection, and Process Control for Microlithography XV at Santa Clara, CA, Feb. 26–Mar. 1, 2001), *Proceedings of SPIE*, vol. 4344, 2001, pp. 222–233 (Abstract only).

Hatab, Ziad R., et al., "Optical Diffraction Tomography for Latent Image Metrology", (Presented at the Metrology, Inspection, and Process Control for Microlithography XI), *Proceedings of SPIE*, vol. 3050, 1997, pp. 271–280 (Abstract only).

McNeil, John R., "Scatterometry Applied to Microelectronics Processing", *LEOS Newsletter*, vol. 14, No. 5, Oct., 2000, pp. 26–27.

Raymond, Christopher J., et al., "Asymmetric Line Profile Measurement Using Angular Scatterometry", (Presented at the Metrology, Inspection, and Process Control for Microlithography XV at Santa Clara, CA, Feb. 26–Mar. 1, 2001), *Proceedings of SPIE*, vol. 4344, 2001, pp. 436–446.

* cited by examiner

*Primary Examiner*—Gregory J. Toatley, Jr.
*Assistant Examiner*—Layla Lauchman
(74) *Attorney, Agent, or Firm*—John P. Taylor

(57) ABSTRACT

A process for measuring alignment of latent images in a photoresist layer of an integrated circuit structure on a semiconductor substrate with a test pattern formed in a lower layer on the substrate comprises the steps of forming a test pattern in selected fields of a first layer on a semiconductor substrate, forming a layer of photoresist over the first layer, forming latent images in portions of the photoresist layer lying in the selected fields overlying the test pattern of the first layer; and measuring the alignment of the test pattern in the selected fields of the first layer with the overlying latent images in the photoresist layer using scatterometry. In a preferred embodiment, the test pattern formed in each of the selected fields in the first layer comprises a pattern of parallel spaced apart lines, and the latent images formed in the portions of the photoresist layer in the selected fields above the test pattern in the first layer also comprises a pattern of parallel spaced part lines, with the two sets of lines interspaced between one another and generally parallel to one another to form a diffraction pattern.

19 Claims, 3 Drawing Sheets

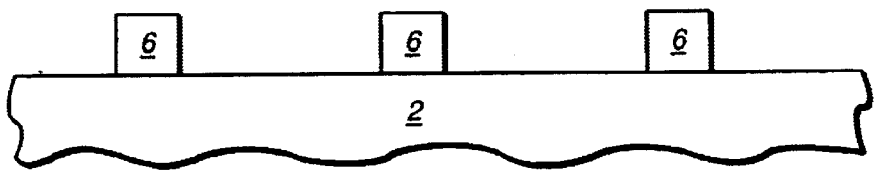
FIG._1
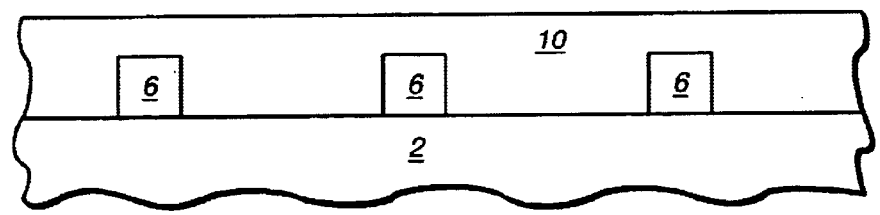
FIG._2
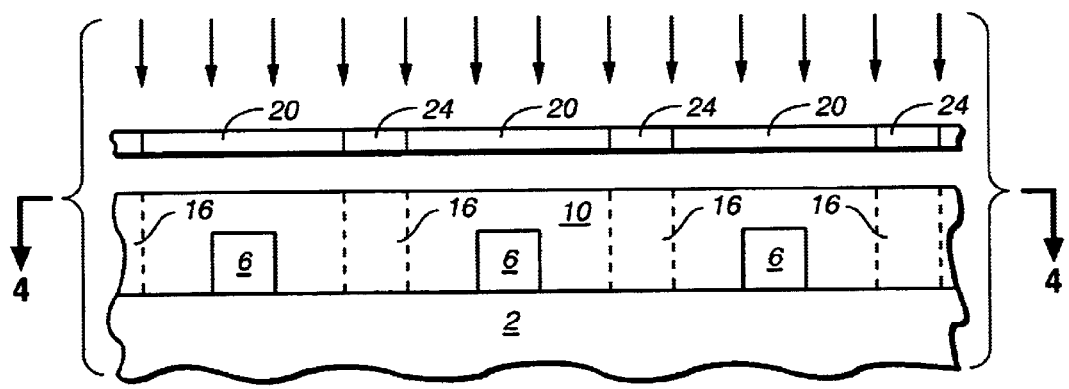
FIG._3
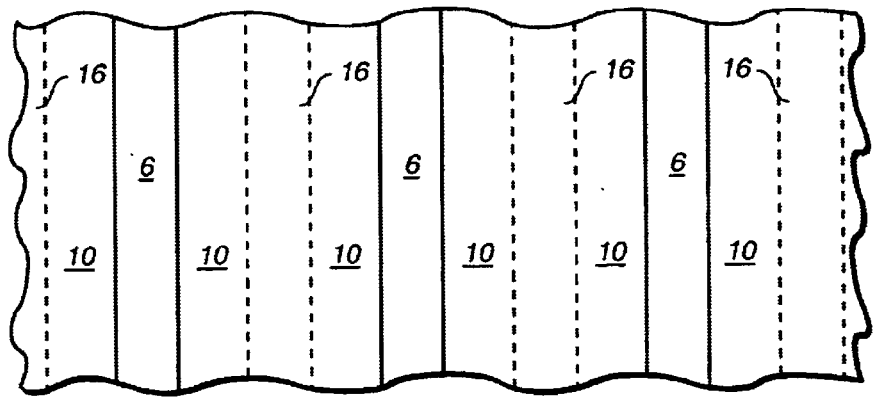
FIG._4

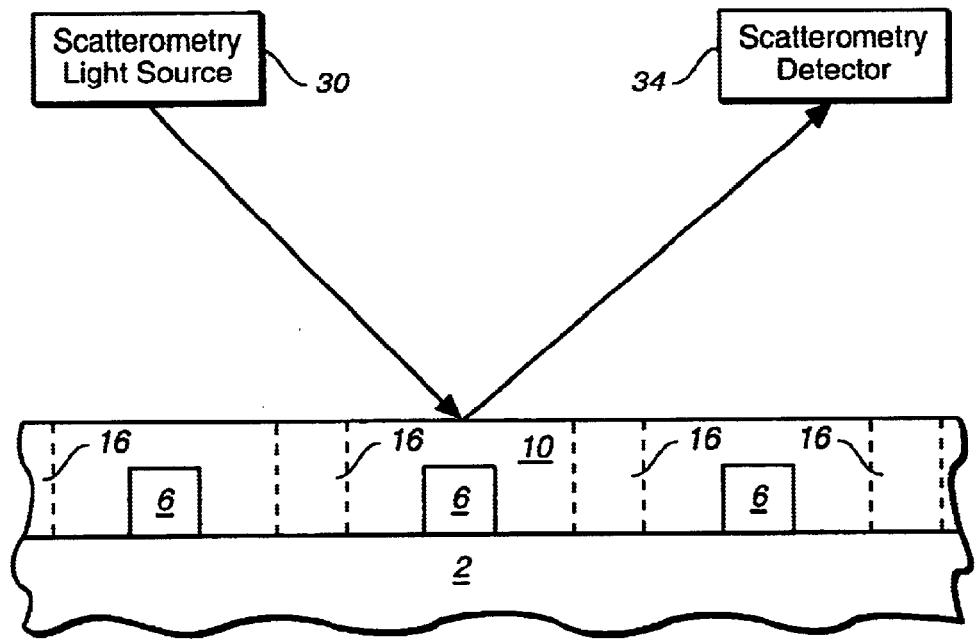
FIG._5
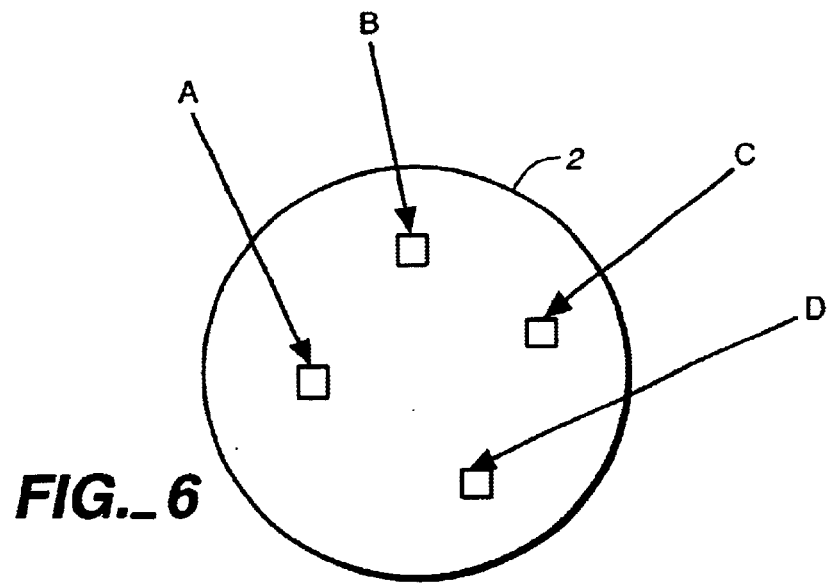
FIG._6

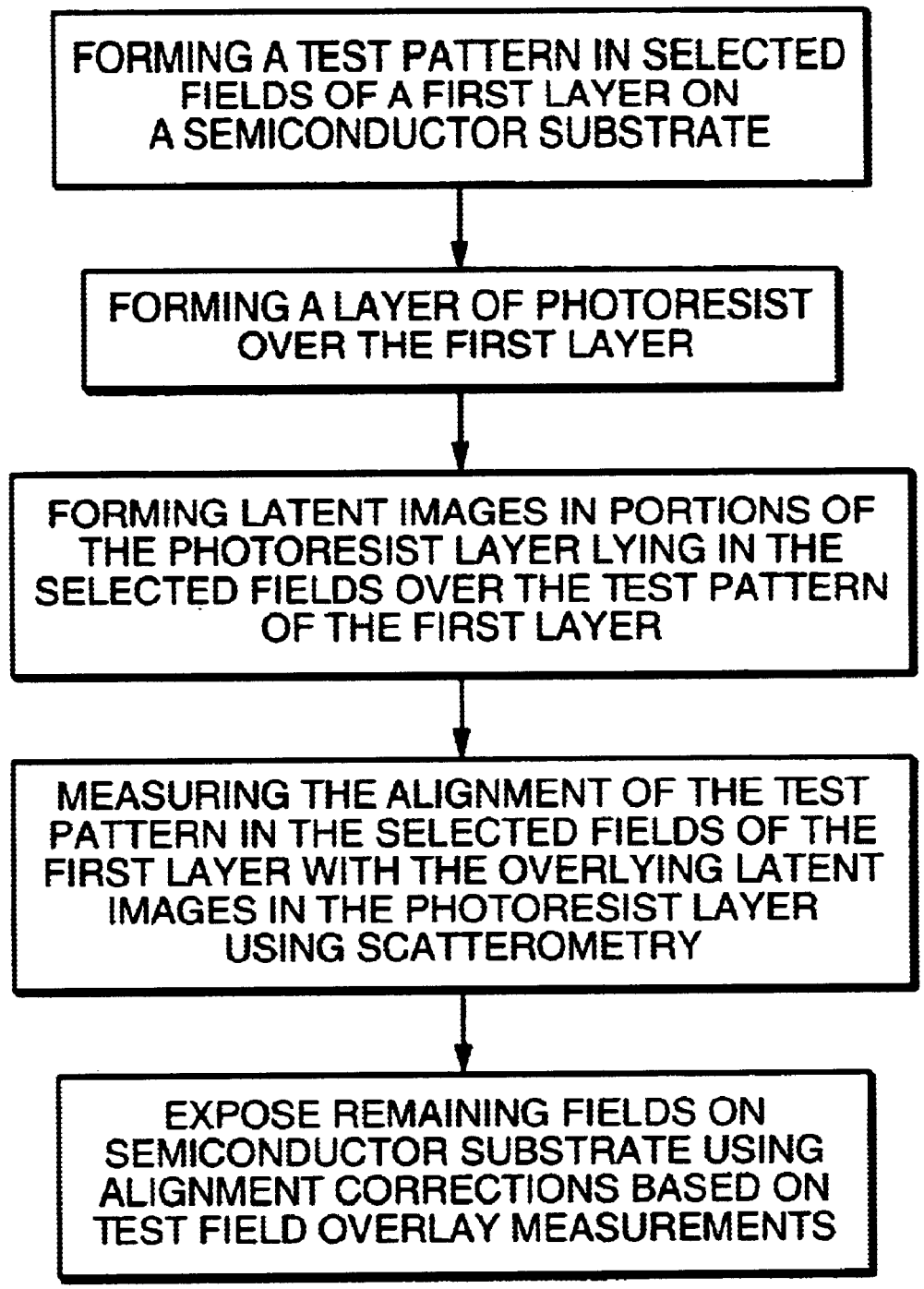
*FIG._7*

ALIGNMENT PROCESS FOR INTEGRATED CIRCUIT STRUCTURES ON SEMICONDUCTOR SUBSTRATE USING SCATTEROMETRY MEASUREMENTS OF LATENT IMAGES IN SPACED APART TEST FIELDS ON SUBSTRATE

BACKGROUND OF THE INVENTION

1. Field of the Invention

This invention relates to a process for alignment of vertically adjoining layers of an integrated circuit structure. More particularly this invention relates to an alignment process using scatterometry measurements of latent images in an upper layer of photoresist and a previously formed structural pattern in a lower layer in test fields on a semiconductor substrate.

2. Description of the Related Art

In the continuing reduction of scale in integrated circuit structures, both the horizontal dimensions of features such as metal lines and the spacing between such features have become smaller and smaller. This, in turn, has lead to an increased need for monitoring of the alignment of the features being formed on one layer of the integrated circuit structure with features already formed in an adjacent underlying layer.

Features such as metal lines, vias, trenches, etc. are usually formed on the integrated circuit structure by photolithography wherein a layer of photosensitive material is formed on the integrated circuit structure and selectively exposed to a pattern of radiation such as visible light through a mask or reticle. The radiation results in a chemical change in the portion of the photoresist exposed to the radiation, thereby forming a latent image of the patterned radiation in the photoresist layer corresponding to a change in solubility between the exposed and unexposed portions of the photoresist layer. The latent image is then developed by baking the photoresist layer followed by contact of the baked and exposed photoresist layer with an etchant or developer resulting in removal of either the exposed or unexposed portion of the photoresist layer, depending upon the type of etchant or developer selected, thereby forming a photoresist mask which can be used to form features such as metal lines.

Accuracy of the formation of features in a particular layer of an integrated circuit structure has been optically monitored using scanning electron microscopy (SEM) on a test wafer, followed by adjustments made to correct errors before proceeding with the run of wafers in which the same pattern of features would be reproduced. More recently scatterometry techniques have been used to monitor defects in a test wafer, wherein radiation is reflected or scattered off targeted features arranged in a diffraction pattern on a test wafer and the degree of alteration or scattering of the diffracted light is detected and compared to known patterns of alteration or scattering of the diffracted light, following which suitable adjustments are made before proceeding with the run of wafers, as in the previous SEM monitoring. In either instance, however, an entire test wafer is expended to accomplish the desired testing of the accuracy of the features. Furthermore, although scatterometry has been used to measure latent (undeveloped) images in a single photoresist layer, conventionally, the latent image is developed (by baking the resist layer and then contacting it with a wet developer or etchant) prior to optical measurement of the resist mask.

Accurate alignment of the features in a particular layer of the integrated circuit structure with features in an underlying layer is also important and must also be monitored. Such monitoring has also been carried out using overlay technology as well as scatterometry. A pattern of parallel lines in one layer, typically a pattern of parallel lines in a 100 $\mu$m by 100 $\mu$m square, is arranged as alternate lines, i.e., the parallel lines in the first layer are arranged such that the parallel lines in the second layer are seen in the spaces between the parallel lines in the first layer and the accuracy of the spacing of the pattern of lines in the upper level to the underlying pattern of lines is measured. However, this has required the use of a test wafer wherein the latent images on the exposed photoresist mask layer are first baked and developed and then analyzed for alignment with the alignment pattern in the underlying layer, necessitating the use of the entire wafer.

It would, therefore, be desirable if the alignment of features on vertically adjoining layers in an integrated circuit structure could be optically monitored without the expenditure of an entire test wafer, and without requiring the development of latent images already formed in selected fields of an upper layer on the wafer.

SUMMARY OF THE INVENTION

The invention comprises a process for measuring alignment of latent images in selected fields of a photoresist layer of an integrated circuit structure on a semiconductor substrate with a test pattern formed in the same selected fields of a lower layer on the substrate by the steps of:

a) forming a test pattern in selected fields of a first layer on a semiconductor substrate;

b) forming a layer of photoresist over the first layer;

c) forming latent images in portions of the photoresist layer lying in the selected fields overlying the test pattern of the first layer; and d) measuring the alignment of the test pattern in the selected fields of the first layer with the overlying latent images in the photoresist layer using scatterometry.

In a preferred embodiment, the test pattern formed in each of the selected fields in the first layer comprises a pattern of parallel spaced apart lines, and the latent images formed in the portions of the photoresist layer in the selected fields above the test pattern in the first layer also comprises a pattern of parallel spaced part lines, with the two sets of lines interspaced between one another and generally parallel to one another to form a diffraction pattern.

BRIEF DESCRIPTION OF THE DRAWINGS

FIG. 1 is a fragmentary vertical side-section view of a portion of an integrated circuit structure having a test pattern of parallel spaced apart metal lines formed thereon.

FIG. 2 is a fragmentary vertical side-section view of the structure of FIG. 1 showing a layer of photoresist formed over the integrated circuit structure and over the test pattern of parallel spaced apart metal lines thereon.

FIG. 3 is a fragmentary vertical side-section view of the structure of FIG. 2 showing a pattern of latent images comprising parallel spaced apart lines being formed in the photoresist layer in between the parallel spaced apart metal lines by selective exposure of the photoresist layer to patterned radiation through a reticle or mask.

FIG. 4 is a sectioned top view of the structure of FIG. 3 taken along lines 4—4.

FIG. 5 is a fragmentary vertical side-section view of the structure of FIG. 3 showing a scatterometry radiation source being directed at an angle against the pattern of spaced apart parallel metal lines and lines of latent images in the photoresist layer, and the image of diffracted radiation being detected.

FIG. 6 is a top view of a semiconductor wafer having preselected test fields A–D in which the test images of metal lines and latent images of lines are formed.

FIG. 7 is a flowsheet illustrating the process of the invention.

DETAILED DESCRIPTION OF THE INVENTION

The invention comprises a process for measuring alignment of latent images in a photoresist layer of an integrated circuit structure on a semiconductor substrate with a test pattern formed in a lower layer on the substrate by the steps of: forming a test pattern in selected fields of a first layer on a semiconductor substrate; forming a layer of photoresist over the first layer; forming latent images in portions of the photoresist layer lying in the selected fields overlying the test pattern of the first layer; and measuring the alignment of the test pattern in the selected fields of the first layer with the overlying latent images in the photoresist layer using scatterometry.

In a preferred embodiment, the test pattern formed in each of the selected fields in the first layer comprises a pattern of parallel spaced apart lines, and the latent images formed in the portions of the photoresist layer in the selected fields above the test pattern in the first layer also comprises a pattern of parallel spaced part lines, with the two sets of lines interspaced between one another and generally parallel to one another to form a diffraction pattern.

Referring now to the drawings, FIG. 1 shows a fragmentary portion 2 of an integrated circuit structure on a semiconductor wafer (not shown) having a test pattern of parallel spaced apart metal lines 6 formed over integrated circuit structure 2. This test pattern of parallel metal lines 6 is used for alignment with latent images of a second set of lines formed in an overlying photoresist layer as will be explained below. Integrated circuit structure 2 may comprise active devices such as transistors having an insulation layer formed thereon, with metal lines 6 then formed over the insulation layer.

The test pattern of parallel metal lines 6 is configured to occupy either all or a portion of one field on the semiconductor wafer, where a field is defined as that portion or position on a semiconductor wafer on which one exposure will be made. It may also be defined as that portion of a wafer individually addressed by a stepper tool to photolithographically process that portion of the wafer independent of the remainder of the wafer. The same or different structures or patterns may then be constructed in other fields representing different positions on the wafer which are sequentially addressed individually by the stepper tool.

As will be noted in FIG. 6, such test patterns of parallel spaced apart metal lines 6 are formed in at least a portion of several test fields distributed across the wafer, as indicated by arrows A–D in FIG. 6, to provide more uniform measurement of the alignment across the entire wafer.

As shown in FIG. 2, after formation of the test patterns in selected fields distributed across the wafer, a layer 10 of photoresist is formed over the entire wafer in a thickness sufficient to cover metal lines 6. Latent images 16 of a second set of parallel spaced apart lines are then formed in photoresist layer 10, using a mask or reticle 20 containing openings 24 through which a radiation image is directed for the same field that is occupied by underlying metal lines 6, as seen in FIG. 3.

The term "latent images", as used herein is meant a pattern of radiation (but undeveloped) portions of a photosensitive material wherein such radiation exposure changes the solubility of such exposed portions to certain solvents (developers) relative to the unexposed regions of the photosensitive material. Conventionally such "latent images" are developed by contact with a solvent or "developer" which dissolves either the exposed or unexposed portion of the photosensitive material to thereby form a photoresist mask.

In accordance with the invention, the undeveloped or "latent image" is used in the alignment process of the invention, not the developed image, to verify the alignment (or measure the degree of alignment) between the pattern of lines (latent images at this point) formed in the photoresist layer with the underlying pattern of parallel spaced apart metal lines. By using the undeveloped latent images for verification of alignment with the underlying metal lines, misalignment problems shown in the test fields can be corrected (e.g., by adjustment of the reticle mount) before the remaining fields of the wafer being tested are exposed to the pattern of integrated circuit structure (the scatter pattern will be incorporated into the actual pattern of integrated circuit structure) and such images may then be developed for such fields. In this way, the entire wafer is not expended as a test wafer to verify the alignment of features such as lines on the respective layers.

The latent images formed in the photoresist layer may be used as a means of verification of the alignment by positioning the underlying metal lines, with respect to the reticle which will be used to form the overlying latent images of parallel lines, so that the overlying latent images of lines, when formed, will each be equally spaced between two adjacent metal lines, as shown in FIG. 4, where line latent images 16 in photoresist layer 10 are shown as equally spaced between metal lines 6 (the theoretical perfect alignment).

Such initial alignment between the pattern of metal lines and the reticle can be made by any other alignment target/detector followed by precise verification of the alignment using the process of the invention. In accordance with the invention, the precise alignment of the underlying pattern of parallel spaced apart metal lines with the pattern of latent images in the photoresist layer is carried out using scatterometry apparatus.

Christopher J. Raymond et al., in an article entitled "Asymmetric Line Profile Measurement Using Angular Scatterometry" presented at Metrology, Inspection, and Process Control for Microlithography XV (at Santa Clara, Calif. on Feb. 26–Mar. 1, 2001) and published in the Proceedings of SPIE, Vol. 4344, 2001, at pages 436–446, defines scatterometry as follows: "Scatterometry is an optical measurement technology based on the analysis of light scattered, or diffracted, from a periodic array of features. It is not an optical imaging technique, but rather a model based metrology that determines measurement results by comparing measured light scatter against a model of theoretical scatter 'signatures'."

In the usage of such scatterometry technology in accordance with the invention, a radiation source 30, as shown in FIG. 5, is directed at an angle onto the respective patterns of metal lines 6 and latent images 16 whereby the metal lines and latent images function together as a diffraction gradient to scatter the radiation. The scattered radiation is then detected by one or more detectors 34 and compared with known patterns of scattered radiation to determine the extent of the variation from a perfect spacing of the latent images 16 with metal lines 6. Such scatterometry tools are commercially available from the Accent Company under the trademark Accent Optical Technologies CDS 200, and from KLA-TENCOR Corp under the trademark ASET-FS (SCD). Another important scatter method is where the light source/detector are at 90° to the sample, and the wavelength (detection) is varied.

It should be noted that the radiation source used in the scatterometry apparatus and diffracted by the latent images formed in the photoresist layer preferably is of a wavelength at which the photoresist layer is not sensitive, i.e., at a wavelength different than the wavelength used to form the latent image in the photoresist layer through the reticle, to avoid exposing the entire photoresist layer to radiation at the wavelength used to form the latent image, i.e., to avoid turning the entire photoresist layer into one latent image. This is carried out, for example, by using photoresist material sensitive to UV light, but not sensitive to visible light, and then using a laser beam of visible light as the radiation source in the scatterometry apparatus. The scatter measurement tool projects a small spot onto the wafer, illuminating a region within the scatter target. Typically a laser beam is used (but not always) and the rest of the wafer is not illuminated.

Following the alignment step, the data concerning any misalignment can be used to move the wafer, with respect to the reticle, so that the remainder of the fields in the wafer can then have an aligned layer subsequently formed thereon.

By only using selected fields of the semiconductor wafer distributed across the face of the wafer to form the test patterns of lines, as shown at arrows A–D in FIG. 6, and then not developing the latent images formed in those fields in order to align the two layers to one another, and by exploiting the ability of scatterometry technology to detect latent images, only selected fields of a wafer need be used to align an underlying pattern of parallel spaced apart metal lines with a pattern of latent images of lines in an overlying photoresist layer.

With the alignment process of the invention, rather than expending an entire test wafer and then relying on the alignment adjustments made on such a wafer to suffice for the remaining wafers in the same batch, each wafer amy be subject to the alignment process of the invention to detect and then correct any misalignment detected in the test fields by the scatterometry apparatus, following which the other fields in the same wafer (which should now be precisely aligned) may be used to form the desired layer over the underlying integrated circuit structure.

It should be noted that the process of the invention makes it possible to utilize two sets of test fields on a particular wafer, if desired. That is, a first set of test fields may be used, as described, to verify the alignment of the reticle with the underlying layer using the latent images formed by the reticle in the photoresist layer, followed by adjustment of the reticle. A second set of latent images of lines could then be formed in a second set of test fields to verify that the corrections already made are satisfactory. (The developed image could be used here.) Since this would expend, for example, 8 fields instead of only 4, it may be more desirous to only use one set of test fields. However, in view of the fact that wafers such as the 8" diameter wafers currently in production, have as many as 200 fields, the expenditure of either 4 or 8 fields may be deemed to be a small price to pay for verification of the accuracy of the alignment.

Thus, the invention utilizes scatterometry technology to analyze the alignment of a pattern of latent images (such as parallel lines) formed in an upper photoresist layer with an underlying pattern (such as parallel lines) formed in selected test fields on a semiconductor wafer. The remaining fields on the same wafer may then be utilized to form the desired integrated circuit structures on the wafer tested. The process of the invention avoids the need for expenditure of an entire test wafer to verify the alignment and also permits each individual wafer to be tested for alignment, and corrected where needed.

Having thus described the invention what is claimed is:

1. A process for measuring alignment of latent images in a photoresist layer of an integrated circuit structure on a semiconductor substrate with a test pattern formed in a lower layer on the substrate which comprises:

a) forming a test pattern in selected fields of a first layer on a semiconductor substrate;

b) forming a layer of photoresist over said first layer;

c) forming latent images in portions of said photoresist layer lying in said selected fields overlying said test pattern of said first layer; and d) measuring the alignment of said test pattern in said selected fields of said first layer with said overlying latent images in said photoresist layer using scatterometry.

2. The process of claim 1 wherein said step of forming a test pattern in said selected fields of said first layer comprises forming a test pattern of lines.

3. The process of claim 2 wherein said step of forming a test pattern of lines in said selected fields of said first layer comprises a test pattern of parallel spaced apart lines.

4. The process of claim 2 wherein said step of forming said test pattern of lines formed in said selected fields of said first layer comprises forming a test pattern of parallel spaced apart metal lines.

5. The process of claim 3 wherein said step of forming latent images in said portions of said photo resist layer lying in said selected fields overlying said test pattern of lines comprises forming a pattern of parallel spaced apart lines.

6. The process of claim 5 wherein said step of forming said latent images of parallel spaced apart lines, in said portions of said photoresist layer lying in said selected fields overlying said test pattern of parallel spaced apart lines in said selected fields of said first layer, further comprises forming said latent images of said parallel spaced apart lines generally parallel to said test pattern of parallel spaced apart lines formed in said selected fields of said upper layer, whereby said test pattern of parallel spaced apart lines formed in said selected fields of said under layer and said latent images of parallel spaced apart lines formed in said portions of said photoresist layer lying in said selected fields form a diffraction grating, the accuracy of which is measured by said scatterometry to determine the alignment of said layers of lines.

7. The process of claim 6 wherein said step of forming said latent images of parallel spaced apart lines further comprises interspacing said latent images of parallel spaced apart lines between said test pattern of parallel spaced apart lines formed in said selected fields of said first layer.

8. A process for measuring alignment of latent images in a photoresist layer of an integrated circuit structure on a semiconductor substrate with a test pattern formed in a lower layer on the substrate which comprises:

a) forming a test pattern of parallel spaced apart lines in selected fields of a first layer on a semiconductor substrate;

b) forming a layer of photoresist over said first layer;

c) forming latent images of parallel spaced apart lines in portions of said photo resistlayer lying in said selected fields overlying said test pattern of parallel lines of said first layer, said parallel lines of said test pattern of said first layer generally parallel with said parallel lines of latent images in said photoresist layer; and d) measuring the alignment of said parallel lines of said test pattern in said selected fields of said first layer with said overlying latent images of parallel lines in said photoresist layer using scatterometry.

9. The process of claim 8 wherein said step of forming a test pattern of parallel spaced apart lines in said selected fields of said first layer comprises forming a test pattern of parallel spaced apart metal lines.

10. The process of claim 8 wherein said step of forming said latent images of parallel spaced apart lines in said photoresist layer and said test pattern of parallel spaced apart lines in said first layer comprises forming said latent images and said test pattern generally parallel to one another to form a diffraction grating, the accuracy of which is measured by said scatterometry to determine the alignment of said layers of lines.

11. The process of claim 10 wherein said latent images of parallel spaced apart lines are interspaced between said test pattern of parallel spaced apart lines formed in said first layer.

12. The process of claim 8 wherein said step of forming latent images of parallel spaced apart lines in said photoresist layer further comprises directing a first source of radiation onto said photoresist layer through a reticle patterned to provide a radiation image of said parallel spaced apart lines on said photoresist layer.

13. The process of claim 12 wherein said step of measuring the alignment of said parallel lines of said test pattern in said selected fields of said first layer with said overlying latent images of parallel lines in said photoresist layer using scatterometry further comprises directing a second source of radiation toward said latent images of lines in said photo resist layer and toward said test pattern of parallel spaced apart lines in said first layer.

14. The process of claim 12 wherein said first source of radiation used to form said latent images in aid photoresist layer comprises ultraviolet light.

15. The process of claim 13 wherein said second source of radiation used in said scatterometry to determine said alignment comprises visible light.

16. The process of claim 13 wherein said second source of radiation used in said scatterometry to determine said alignment comprises a radiation source selected from the group consisting of an electron beam, an ion beam, and a laser beam.

17. A process for measuring alignment of latent images in a photoresist layer of an integrated circuit structure on a semiconductor substrate with a test pattern formed in a lower layer on the substrate which comprises:

a) forming a test pattern of parallel spaced apart metal lines in selected fields of a first layer on a semiconductor substrate;

b) forming a layer of photoresist over said first layer;

c) forming latent images of parallel spaced apart lines in portions of said photoresist layer lying in said selected fields overlying said test pattern of parallel lines of said first layer, said parallel lines of said test pattern of said first layer generally parallel with said parallel lines of latent images in said photoresist layer;

d) measuring the alignment of said parallel lines of said test pattern in said selected fields of said first layer with said overlying latent images of parallel lines in said photoresist layer using scatterometry; and e) forming a further layer of integrated circuit structure over said first layer on said integrated circuit structure in fields not used for said alignment.

18. A process for measuring alignment of latent images in selected fields of a photoresist layer of an integrated circuit structure on a semiconductor substrate with a test pattern formed in said selected fields on an upper layer on the substrate underlying said photoresist layer which comprises:

a) forming a test pattern in said selected fields of said upper layer on said semiconductor substrate;

b) forming a layer of photoresist over said upper layer;

c) forming latent images in portions of said photoresist layer lying in said selected fields of said photoresist layer overlying said test patterns in said selected fields of said upper layer; and d) measuring the alignment of said test patterns in said selected fields of said upper layer with said overlying latent images in said selected fields in said photoresist layer using scatterometry;

whereby alignment of said test pattern in said selected fields in said upper layer on said semiconductor substrate with said latent images in said selected fields of said photoresist layer permits the remaining fields in said semiconductor substrate to be conventionally processed to form semiconductor structures.

19. The process of claim 18 wherein said step of forming a test pattern in said selected fields of said upper layer on said semiconductor substrate further comprises forming a test pattern of parallel spaced apart metal lines in said selected fields of said upper layer on said semiconductor substrate; and said step of forming latent images in portions of said photoresist layer lying in said selected fields of said photo resist layer overlying said test patterns in said selected fields of said upper layer further comprises forming latent images in said photoresist layer comprising a test pattern of parallel spaced apart metal lines.

* * * * *